US009450572B2

(12) United States Patent
Jensen et al.

(10) Patent No.: US 9,450,572 B2
(45) Date of Patent: Sep. 20, 2016

(54) SELF-CASCADABLE PHASE SHIFTER

(71) Applicant: Anaren, Inc., East Syracuse, NY (US)

(72) Inventors: Bo Jensen, Minoa, NY (US); Chong Mei, Jamesville, NY (US)

(73) Assignee: Anaren, Inc., East Syracuse, NY (US)

( * ) Notice: Subject to any disclaimer, the term of this patent is extended or adjusted under 35 U.S.C. 154(b) by 29 days.

(21) Appl. No.: 14/571,323

(22) Filed: Dec. 16, 2014

(65) Prior Publication Data

US 2016/0173073 A1 Jun. 16, 2016

(51) Int. Cl.
*H01P 1/18* (2006.01)
*H03K 5/13* (2014.01)
*H01P 9/00* (2006.01)
*H03K 5/00* (2006.01)

(52) U.S. Cl.
CPC ....... *H03K 5/13* (2013.01); *H03K 2005/00286* (2013.01)

(58) Field of Classification Search
CPC .......... H01P 9/00; H01P 9/006; H01P 1/184
USPC ................................. 333/140, 116, 156, 161
See application file for complete search history.

(56) References Cited

U.S. PATENT DOCUMENTS

| 5,032,802 | A  | * | 7/1991 | Fry ........................... | H01P 5/16 333/109 |
| 6,049,262 | A  | * | 4/2000 | Mazzochette ............. | H01P 3/08 333/238 |
| 6,522,222 | B1 | * | 2/2003 | Pchelnikov ............... | H01P 9/02 333/156 |
| 7,042,309 | B2 | * | 5/2006 | Podell ...................... | H01P 5/187 333/112 |
| 7,319,370 | B2 | * | 1/2008 | Napijalo .................. | H01P 5/185 333/116 |
| 7,728,694 | B2 | * | 6/2010 | Jensen .................. | H01P 11/003 333/116 |

* cited by examiner

*Primary Examiner* — Dean Takaoka
(74) *Attorney, Agent, or Firm* — Bond Schoeneck & King, PLLC; David Nocilly; George McGuire

(57) ABSTRACT

A self-cascadable phase shifter having a two corresponding pairs of input and output pins. Each pair of input and output pins are interconnected by phase delay circuitry that is isolated from phase delay circuitry interconnecting the other pair of input and output pins so that each pair of input and output pins produces, for example, a 90 degree phase shift. The resulting phase shifter can be used to produce a 90 degree by using one pair of input and output pins or cascading both pairs of input and output pins to provide a 180 degree delay.

13 Claims, 5 Drawing Sheets

SELF-CASCADABLE PHASE SHIFTER

BACKGROUND OF THE INVENTION

1. Field of the Invention

The present invention relates to phase shifters and, more specifically, to a phase shifter that can be used for both a 90 and a 180 degree delay.

2. Description of the Related Art

Phase shifters are used to change the transmission phase angle of a network and are used for various systems, including phased array antennas and radiofrequency (RF) and microwave applications. Standard phase shifters typically have a fixed phase shift over a given frequency range. As a result, it is often necessary to connect in series two separate phase shifters to accomplish a larger phase shift that is possible with a particular phase shifter. Accordingly, there is a need in the art for a single phase shifter that can be used to accomplish more than one fixed phase shift without the need to attach additional phase shifters.

BRIEF SUMMARY OF THE INVENTION

The present invention comprises a phase shifter having a body supporting a pair of opposing ground pads, a first input, a first output, a second input and a second output. First phase delay circuitry is positioned in the body and electrically interconnects the first input with the first output to produce a first predetermined phase delay in a signal provided to the first input. Second phase delay circuitry is also positioned in the body and electrically interconnects the second input with the second output to produce a second predetermined phase delay in a signal provided to the second input. An electrical connection between the first output and the second input will produce a third predetermined phase delay in a signal that is the sum of the first predetermined phase delay and the second predetermined phase delay. Preferably, the predetermined phase delays are each 90 degrees so that cascading the two phase delay circuits allows for a total phase delay of 180 degrees. The first phase delay circuitry is formed on a one layer of the body and the second phase delay circuitry is formed on another layer of the body. A dielectric layer separates the two phase delay circuitry layers of the body and each layer is capped ground pad layers. The phase shifter may be used by connecting the first output to the second input then providing a signal to the first input and receiving a phase shifted signal at the second output. As the first phase delay circuit provides a first predetermined phase delay and the second phase delay circuit provides a second predetermined phase delay, the final output will be phase shifted by the sum of the first predetermined phase delay and the second predetermined phase delay.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
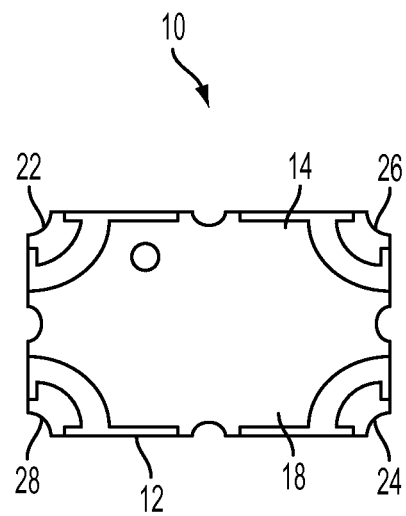
FIG. 1 is a top plan of a phase shifter according to the present invention.
Figure 2:
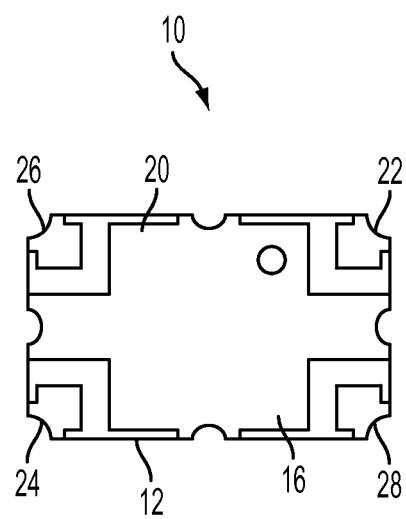
FIG. 2 is a bottom plan of a phase shifter according to the present invention.

Referring now to the drawings, wherein like reference numerals refer to like parts throughout, there is seen in FIGS. 1 and 2 a phase shifter 10 having a body 12 with a top surface 14 and a bottom surface 16. Body 12 includes a pair of ground pads 18 and 20 positioned on top surface 14 and bottom surface 16, respectively. Body 12 additionally includes a first input pin 22 associated with a first output pin 24, and a second input pin 26 associated with a second output pin 30. As seen in FIG. 1, first input pin 22 is positioned diagonally opposite first output pin 24, and second input pin 26 is positioned diagonally opposite output second pin 28 about body 12. Input pins 22 and 26 as well as output pins 26 and 28 are spaced apart from ground pads 14 and 16 so that they are electrically isolated from each other by a suitable dielectric used to form body 12.

Figure 3:
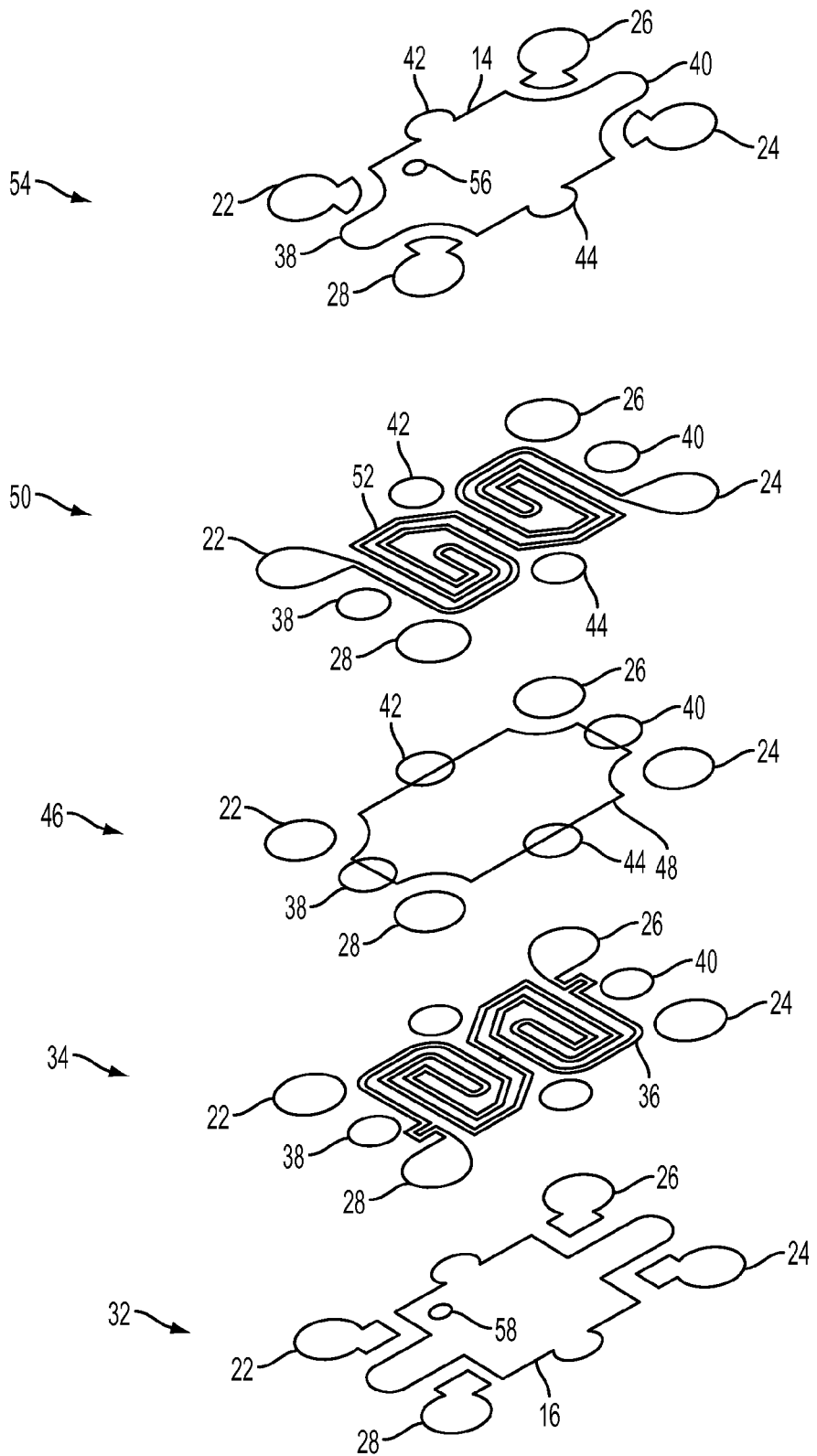
FIG. 3 is an exploded view of the layers of a phase shifter according to the present invention.

Referring to FIG. 3, phase shifter 10 is configured so that an input provided to first input pin 22 will result in an output at first output pin 24 that is delayed by 90 degrees. Similarly, an input provided to second input pin 26 will result in an output at second output 28 that is delayed by 90 degrees. More specifically, phase shifter 10 includes a first layer 32 supporting ground pad 16 having electrically conductive portions positioned at each corner to define a portion of inputs 22 and 26 as well as outputs 26 and 28. Inputs 22 and 26 as well as outputs 26 and 28 are electrically isolated from ground pad 16. A second layer 34 is positioned over first layer 32 and includes first phase delay circuitry 36 interconnecting second input pin 26 with second output pin 28. First phase circuitry 36 can comprise any conventional phase delay circuitry that provides the desired phase shift, such as 90 degrees. For a frequency range of 900-1000 MHz, phase shifter 10 can provide a return loss (dB min) of about 22, an insertion loss (dB max) of about 0.2 and an insertion phase at 1 GHz of 90 degrees plus or minus 5 degrees. Notably, first input pin 22 and first output pin 24 remain electrically isolated from each other and first phase delay circuitry 36. Second layer 34 also includes two opposing pairs of ground posts 38, 40 and 42, 44, respectively, for electrically interconnecting ground pad 16 to ground pad 14 throughout the depth of body 12. A third layer 46 is positioned over second layer 34 and includes a central dielectric member 48 that exposes at least a portion of both pairs of ground posts 38, 40 and 42, 44, but otherwise electrically isolates second layer 44. A fourth layer 50 is positioned over third layer 46 and includes second phase delay circuitry 52 interconnecting first input pin 22 with first output pin 24. Notably, second input pin 26 and second output pin 28 remain electrically isolated from each other and second phase circuitry 52. A fifth layer 54 includes ground pad 14 and having electrically conductive portions positioned at each corner to further define inputs 22 and 26 as well as outputs 26 and 28. Each layer is separated by about 10 millimeter of dielectric, such as RO3006 ceramicfilled PTFE composite. It should be recognized by those of skill in the art that a housing may be provided around body 12 and appropriate connectors to allow wires or cabling to be securely connected to inputs 22 and 26, outputs 26 and 28, and ground pads 14 and 16. Alignment marks 56 and 58 may be provided for use of use of phase shifter 10.

Figure 4:
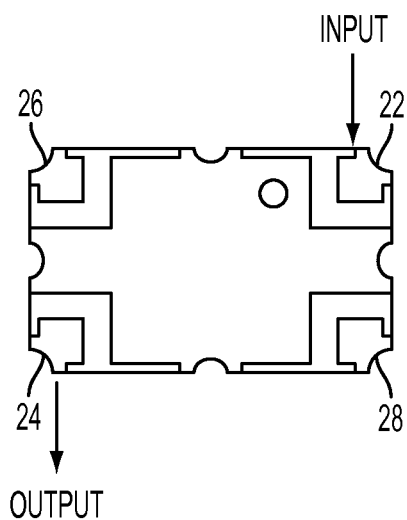
FIG. 4 is a schematic of a wiring configuration for a phase shifter according to the present invention.
Figure 5:
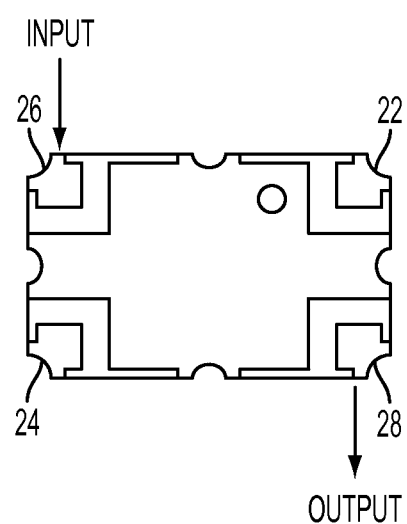
FIG. 5 is a schematic of another wiring configuration for a phase shifter according to the present invention.
Figure 6:
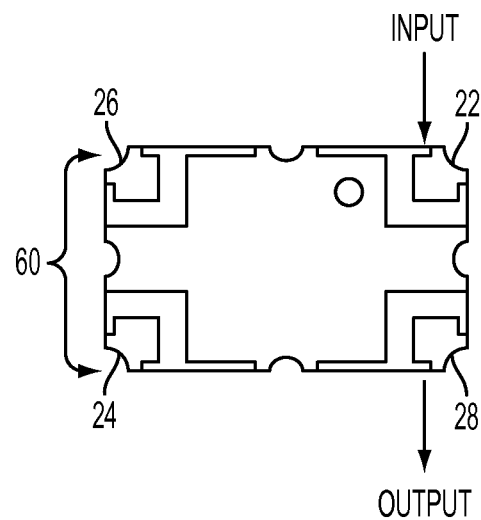
FIG. 6 is a schematic of an additional wiring configuration for a phase shifter according to the present invention.
Figure 7:
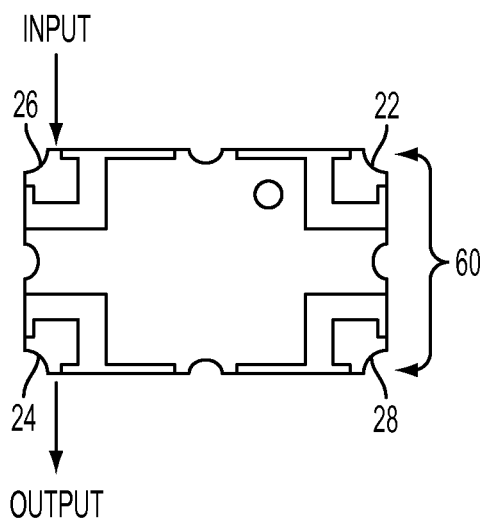
FIG. 7 is a schematic of a further wiring configuration for a phase shifter according to the present invention.
Figure 8:
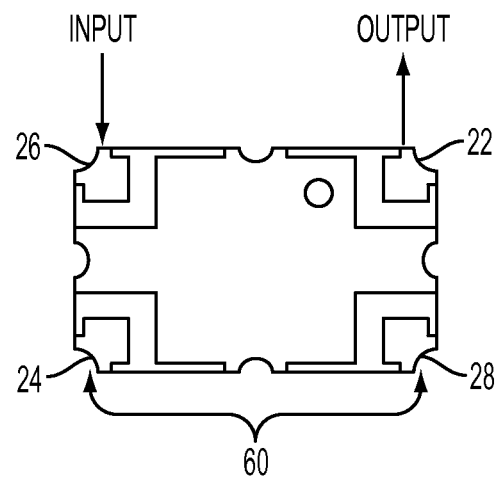
FIG. 8 is a schematic of yet another wiring configuration for a phase shifter according to the present invention.
Figure 9:
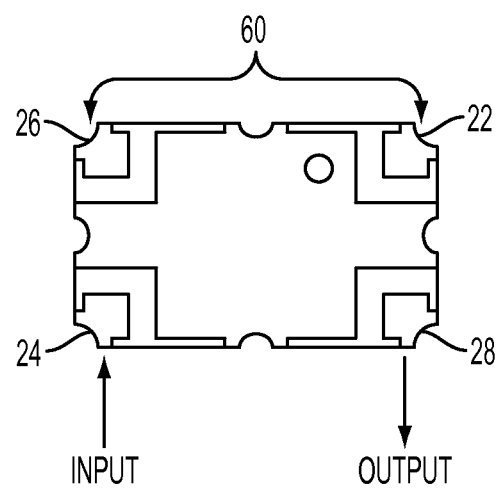
FIG. 9 is a schematic of yet an additional wiring configuration for a phase shifter according to the present invention.

Referring to FIGS. 4 through 9, phase shifter 10 can be used to provide for both 90 degree and 180 degree phase shifts. For example, as seen in FIG. 4, connecting an input to first input pin 22 and an output to first output pin 24 will provide a 90 degree shift. Similarly, as seen in FIG. 5, connecting an input to second input pin 26 and an output to second output pin 28 will provide a 90 degree delay. As seen in FIG. 6, an input may be connected to first input pin 22, a connecting line or jumper 60 run from first output pin 24 to second input pin 26 and an output line connected to second output pin 28 to provide a 180 degree delay. As seen in FIG. 7, an input may be connected to second input pin 26, a jumper 60 run from second output pin 28 to first input pin 22 and an output line connected to first output pin 24 to provide a 180 degree delay. As phase delay circuitry 36 and 52 can operate in either direction of input and output, one phase delay path may be operated from input pin to output pin, while the second is operated from output pin to input pin. For example, as seen in FIG. 8, an input provided at a second input pin 26 can have the output at second output pin 28 shunted by jumper 60 to first output pin 24 to produce a cascaded output at first input pin 22. Similarly, as seen in FIG. 9, an input at first output pin 24 produces an output at first input pin 22 that can be is shunted by jumper 60 to second input pin to produce a delayed output at second output pin 28.

What is claimed is:

1. A phase shifter comprising:
   a body supporting a pair of opposing ground pads, a first input, a first output, a second input and a second output;
   first phase delay circuitry positioned in the body and electrically interconnecting the first input with the first output to produce a first predetermined phase delay in a signal provided to the first input; and
   second phase delay circuitry positioned in the body and electrically interconnecting the second input with the second output to produce a second predetermined phase delay in a signal provided to the second input;
   wherein an electrical connection between the first output and the second input will produce a third predetermined phase delay in a signal that is the sum of the first predetermined phase delay and the second predetermined phase delay.

2. The phase shifter of claim 1, wherein the first predetermined phase delay is 90 degrees.

3. The phase shifter of claim 2, wherein the second predetermined phase delay is 90 degrees.

4. The phase shifter of claim 3, wherein the first phase delay circuitry is formed on a first layer of the body and the second phase delay circuity is formed on a second layer of the body.

5. The phase shifter of claim 4, wherein the first and second layers of the body are separated by a third layer.

6. The phase shifter of claim 5, wherein the third layer comprises a dielectric.

7. A method of using a phase shifter, comprising the steps of:
   providing a body supporting a pair of opposing ground pads, a first input, a first output, a second input and a second output and having first phase delay circuitry electrically interconnecting the first input with the first output to produce a first predetermined phase delay in a signal provided to the first input and second phase delay circuitry electrically interconnecting the second input with the second output to produce a second predetermined phase delay in a signal provided to the second input, wherein an electrical connection between the first output and the second input will produce a third predetermined phase delay in a signal that is the sum of the first predetermined phase delay and the second predetermined phase delay;
   connecting the first output to the second input; and
   providing a signal to the first input and receiving a phase shifted signal at the second output.

8. The method claim 7, wherein the first phase delay circuit provides a first predetermined phase delay and the second phase delay circuit provides a second predetermined phase delay.

9. The method of claim 8, wherein the first predetermined phase delay is 90 degrees.

10. The method of claim 9, wherein the second predetermined phase delay is 90 degrees.

11. The method of claim 10, wherein the first phase delay circuitry is formed on a first layer of the body and the second phase delay circuity is formed on a second layer of the body.

12. The method of claim 10, wherein the first and second layers of the body are separated by a third layer.

13. The method of claim 12, wherein the third layer of the body comprises a dielectric.

* * * * *